United States Patent

Yuan et al.

[11] Patent Number: 6,069,417
[45] Date of Patent: May 30, 2000

[54] STAGE HAVING PAIRED E/I CORE ACTUATOR CONTROL

[75] Inventors: Bausan Yuan, San Jose; Ting-Chien Teng, Fremont, both of Calif.

[73] Assignee: Nikon Corporation, Japan

[21] Appl. No.: 09/141,762

[22] Filed: Aug. 27, 1998

[51] Int. Cl.[7] .................................................. H02K 41/00
[52] U.S. Cl. ............................................................ 310/12
[58] Field of Search ................................ 310/12, 13, 14; 318/135

[56] References Cited

U.S. PATENT DOCUMENTS

| | | | |
|---|---|---|---|
| 4,623,202 | 11/1986 | Shingu | 310/90.5 |
| 4,629,262 | 12/1986 | Hamilton | 310/90.5 |
| 4,952,858 | 8/1990 | Galburt | 318/647 |
| 5,013,987 | 5/1991 | Wakui | 318/632 |
| 5,115,192 | 5/1992 | Bardas et al. | 324/207.12 |
| 5,196,745 | 3/1993 | Trumper | 310/12 |
| 5,227,948 | 7/1993 | Boon et al. | 361/144 |
| 5,294,854 | 3/1994 | Trumper | 310/90.5 |
| 5,467,244 | 11/1995 | Jayawant et al. | 361/144 |

*Primary Examiner*—Nestor Ramirez
*Assistant Examiner*—Judson H. Jones
*Attorney, Agent, or Firm*—Skjerven, Morrill, MacPherson, Franklin & Friel LLP

[57] ABSTRACT

A fine stage control system for use for instance in a semiconductor lithography machine, uses a pair of opposing (push-pull) E/I core actuators to move the stage with high precision along an axis. The paired actuators are coupled together mathematically in terms of their control characteristics and controlled as a single entity, thereby providing a more efficient control scheme and improved system performance.

12 Claims, 4 Drawing Sheets

STAGE HAVING PAIRED E/I CORE ACTUATOR CONTROL

BACKGROUND

1. Field of the Invention

This invention relates to precision control and more particularly to control of a fine stage positioned by two opposing E/I core actuators.

2. Description of the Prior Art

Fine stages are well known and are typically used, for instance in the semiconductor field, for moving reticles (masks) or wafers. For instance Trumper U.S. Pat. No. 5,196,745 discloses a device for controlling the relative position between a moveable platen and a stator having a range of movement in the 200 to 300 mm range. This is typically used in a wafer stepping machine for photolithography and also for applications in other areas, for instance precision machine tools. Such devices typically use some sort of electro-magnetic actuator to drive the stage.

These actuators are various types of sophisticated motors which provide linear motion along an axis. One type of motor commonly used in such devices is a voice coil motor which provides bidirectional movement along an axis using a principle similar to that of a loud speaker. (It is to be appreciated that such fine stages only allow a very small amount of linear motion, as described above.)

Voice coil motors provide precision movement, but disadvantageously consume large amounts of electric current and hence produce large amount of waste heat. This is undesirable because the heat adversely affects the precision of the metrology (position measurement) which is required in such systems. Such systems often use laser interferometry to measure the actual position of the stage, and the heat interferes with the interferometry accuracy. Hence, Boone et al. U.S. Pat. No. 5,227,948 discloses a stage moved by two opposing electro-magnetic actuators, each of which is attractive. One such actuator is provided on each side of the stage to pull the stage, either to the left or the right, along the axis. This avoids the need for a voice coil motor. Such push-pull actuator system devices however have relatively complex control characteristics since both actuators must be controlled simultaneously to achieve the desired positioning precision. In such systems, complexity of control is a significant drawback. This is especially the case since in the typical system motion is desired not just along a single axis but actually typically along three axis which are orthogonal to one another, thus providing six degrees of freedom.

SUMMARY

In accordance with this invention, an object (for instance a stage) is moved along an axis under the influence of two independent (push-pull) E/I core actuators, which are attractive actuators. The relationship between the two independent actuators is established by a non-linear position compensation process. As a result, operation of these two actuators is modeled and controlled as if they were a single entity, instead of requiring two independent control systems. Only the total travel distance of the stage needs to be measured prior to the control process. The desired force (i.e., current output) of each actuator is calculated by a scaling of the nominal force by multiplying the nominal force times the E-I core gap to total stage travel distance ratio.

Further, because the resulting force is the difference of two opposing forces (from the two opposing actuators), a complete mathematical calculation of each individual actuator's force output is not necessary. Advantageously non-linear compensation in accordance with the invention mathematically couples the two independent E/I core actuators in terms of their control systems, thereby allowing them to be controlled as if they were a single entity in terms of the supplied current.

DETAILED DESCRIPTION

Figure 1:
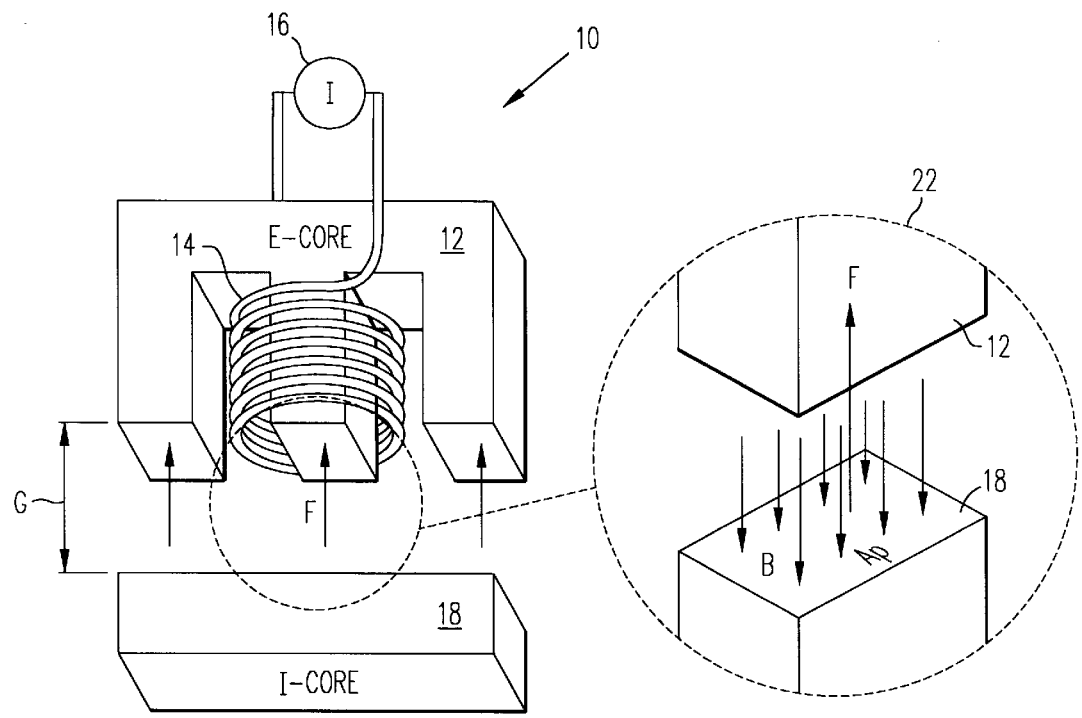
FIG. 1 shows the structure of a conventional E/I core actuator.

FIG. 1 shows in a perspective view a conventional E/I core actuator used in accordance with one embodiment of this invention. Such devices are well known and commercially available. They are essentially an electro-magnetic attractive device. They are so named because they consist of two main magnetic components, the first which is the so called "E core" 12 which is a structure, for instance of iron, having the shape of a letter E with an insulated electric coil (wire) 14 wound around the center bar of the E and a source of current 16 providing D.C. electric current to the coil. This creates an electro-magnetic field which attracts the associated (e.g. iron) I shaped core 18. The electro-magnetic force F is exerted across the width of a gap G.

It is to be understood that in use typically the E core 12 is firmly attached to a framework and the I core 18 is attached to (or is) a side of the stage which is thereby attracted to the E core. Of course, this configuration can be reversed and the I core can be the fixed portion and the E core the moveable portion, but this is usually less inconvenient. The detail 22 of FIG. 1 shows the force F being exerted across the gap G between the E core 12 and the I core 18. This is a magnetic attraction only; such E-I core devices are not capable of repulsive action, by their nature. The force F has the following value:

$$F = \left(\frac{\mu_o A_p N^2}{4}\right)\left(\frac{I}{G}\right)^2, \text{ so}$$

$$F = K\left(\frac{I}{G}\right)^2$$

where $\mu_O$=permeability of air (h/m)

$A_P$=pole area (m$^2$)

N=number of turns in coil on center leg of the e-core

I=current through the coil (amp)

G=gap (m)

F=(NEWTON)

Figure 2:
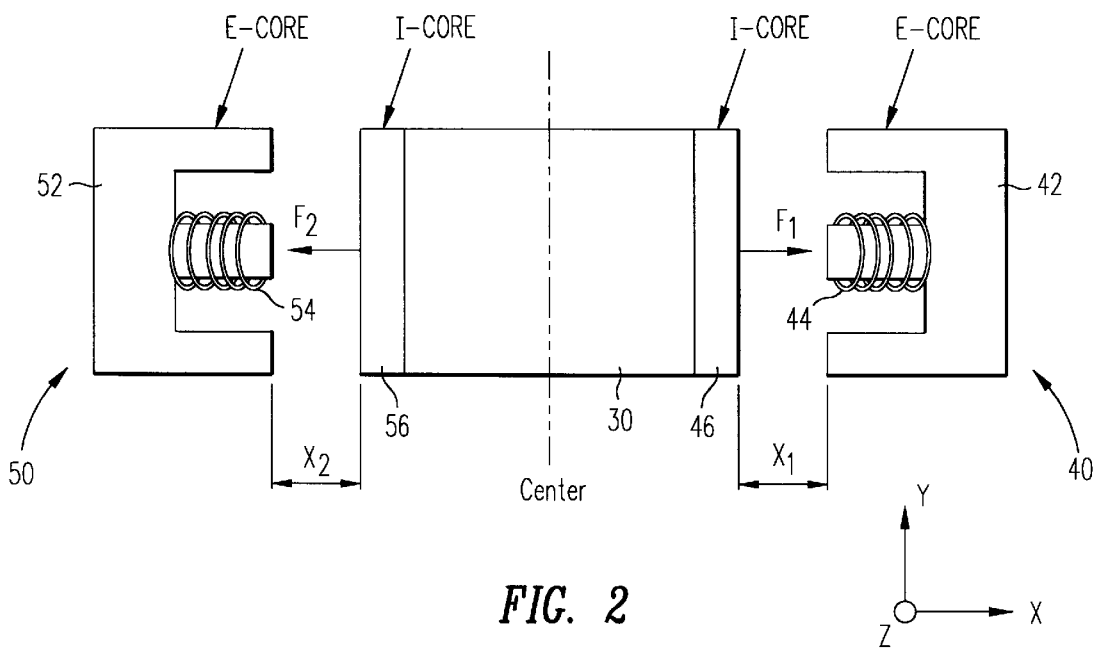
FIG. 2 shows schematically a stage assembly in accordance with this invention.

The well known properties of the E/I core actuator shown in FIG. 1 are used in accordance with this invention as shown in FIG. 2 which is a simplified plan view of a stage assembly. It is to be understood that the actual stage or object 30 typically moves on a base (not shown) on which it is supported by a bearing system such as roller bearings or air bearings; this is conventional. Typically the assembly of FIG. 2 is a fine stage conventionally located on a coarse stage (not shown). The stage 30 (or other object to be moved) typically is guided by some sort of guide rails or guide structure mounted for instance on the base structure (which may be the associated coarse stage), but again the guides are not shown as being conventional. Only two degrees of freedom of movement are shown in FIG. 2, for movement along the X axis. The X, Y and Z axes are depicted in FIG. 2.

To the right hand side of FIG. 2 is shown the first E/I core 40 which is of the type depicted in FIG. 1 having the E core 42, the associated coil 44, and exerting attractive force F1. A controllable source of current (not shown) is connected to the coil 44. Actuator 40 has I core 46 which as shown is fixed to (or a part of) the side of the stage 30.

A similar structure shown to the left hand side of the stage 30 includes the second actuator 50 which includes the E core 52 and the associated coil 54. The second actuator 50 exerts attractive force F2. As shown, both forces F1 and F2 are attractive only. The centerline of the assembly is shown for purposes of understanding but of course is not a structural element.

Therefore in use the stage 30 moves to the right under the influence (F1) of actuator 40 and to the left under the influence (F2) of actuator 50. The amount of movement is determined by the amounts of force F1 and F2 which in turn, as described above, are each a function of the amount of current sourced to each of the actuators 40, 50.

The dynamics of each of the actuators 40, 50 is as shown in FIG. 1. For each actuator, given the force F which it is intended to exert, the necessary current which must be supplied to its coil is calculated as: $I = G \cdot K' \sqrt{F}$, where G is the gap between the E core and the I core for that actuator and K' is a constant.

For a pair of E/I core actuators of the type shown in FIG. 2, the force balance is:

$F1 = Fo + \Delta F$ $F2 = Fo - \Delta F$ where $F_0$ is the offset force and $\Delta F$ is the force from the output of the actuator controller, which is intended that the actuator exert. In other words, $F_0$ is the nominal force from current $I_0$ for each actuator. The magnitude of $\Delta F$ for each of the two actuators is the same but the sign is different.

With reference to FIG. 2, the stage 30 moves to the left and the right along the X axis. Therefore, at any given time it is possible to measure the actual position of the stage 30 in terms of the gap between each actuator 40, 50 E core and the associated I core. These gaps are, at the particular position shown in FIG. 2, respectively $X_1$ and $X_2$. When as shown in FIG. 2 the stage is at its dead center position, $X1 = X2 = D$ and $\Delta F = 0$, hence $F1 = F2 = F_0$. For c purposes, constant K' referred to above can be scaled (normalized) so as to make the output force from the controller, designated f, equal to the square of the desired current $I_O$, so that $I_O = C^* \sqrt{f}$, where C=1. Hence this calculation is a normalization process.

The actuator controller output f can be used directly to provide the non-linear compensation, as described above, for each actuator. The final desired current I supplied to each actuator then becomes a function of f and the proportional distance from the center of the pair E/I cores. Hence distance D represents the total maximum travel of the stage, or in other words the maximum value of X1 or X2. Then for each actuator $I = (X/D) \sqrt{f}$, where X is the actual gap (X1 or X2) between the E/I cores, and D is the nominal gap.

Hence for control applications of the assembly shown in FIG. 2, the total travel distance D is easily measured in advance (off-line), after the offset current $I_0$ is chosen. $I_0$ is the same for the opposite E/I cores of the same pair. This greatly simplifies the non-linear compensation in the control scheme. Note that typically in this example when the course stage is stationary, the total fine stage travel distance D is only about 400 micrometers but of course this is not limiting.

Figure 3:
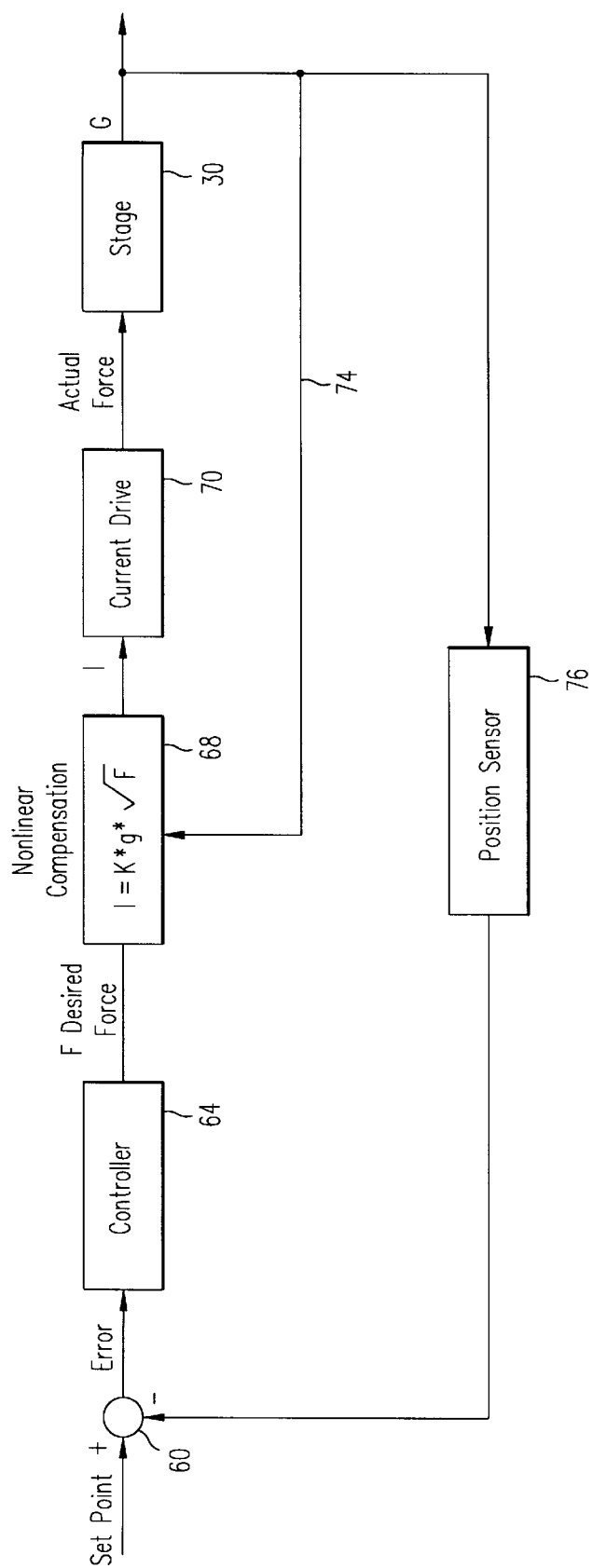
FIG. 3 shows a control system in accordance with this invention.

A control system therefore in accordance with the invention for controlling the stage assembly of FIG. 2 is shown in the form of a block diagram in FIG. 3. It is understood that this is a block diagram and not an actual circuit, since typically the depicted control functionality is conventionally provided by a programmed microprocessor or microcontroller. It would be well within the skill of one of ordinary skilled in the art to write the needed control program code in light of this disclosure and hence the code itself is not provided herein.

Hence, FIG. 3 depicts the control apparatus and operation in the form of a feedback control loop. In addition to the conventional components present in FIG. 2 there is also provided a variable current source to provide the current to each coil 44, 54. Also a conventional position sensor is associated with each actuator 40 and 50 to measure the gap between the E core and the I core for each actuator at any given time. For instance this is a capacitive sensor. A method of calibrating this position sensor is disclosed in copending commonly owned and invented application Ser. No. 09/139,954, "Capacitive Sensor Calibration Method And apparatus for Opposing Electro-Magnetic Actuators", incorporated herein by reference in its entirety.

The control loop shown in FIG. 3 includes at the left the summing node 60 which sums the set point (provided from an external source to indicate the desired position of the stage 30) and the feedback signal. This sum from node 60 is then input as an error signal to the controller 64, which as explained above is typically a program executed by a microprocessor or microcontroller. The controller 64 determines the amount of desired force F which each particular actuator is to exert at a particular time to reach the desired stage position. The next block 64 provides the non-linear compensation calculation, also undertaken for instance by the microprocessor or microcontroller, which carries out the calculation described above using the E-I core gap g (for instance, distance X1 or X2), the input force F and a constant value K which is a linear function of the total travel distance D.

This non-linear compensation calculation 68 determines a particular amount of current I which is then supplied by the current drive controller 70 which includes for instance the controllable (variable) current source. Current I is applied to the actuator coil which thereby exerts a particular actual force on the stage 30. This actual force moves the stage 30 so that a gap g (which is measured by a suitable e.g., capacitive sensor) is present between the E and I cores of the actuator, and the measured value of gap g is fed back by line 74 to block 68. At the same time, a separate stage position sensor 76 measures the position of stage 30 and feeds this back to node 60, so as to properly position stage 30. The control scheme carried out by the FIG. 3 system is carried out the same for each of the two actuators 40 and 50 except for the positive/negative signs.

Hence, the total stage 30 travel distance, which in the above equations is the value D, is easily measured when the system is initially calibrated. Typically this does not change later. This value D appears in the constant K in the equation for the non-linear compensation 68. Hence the only two relevant values to determine I on an on-going basis are the actual measured E/I core gap g (distances X1 and X2 in FIG. 2) and the desired force F. Hence this provides a simplified and rapid means for determining the amount of current I to be sourced at any time to each of the actuators.

While the system of FIG. 2 is capable of movement in only two degrees of freedom, (to the left and right along the X axis), of course a similar set of two opposing actuators can be used to provide movement along the Y axis for two more degrees of freedom and also along the Z (vertical) axis providing two additional degrees of freedom. In the Z axis direction typically force must be exerted to counteract gravity acting on the stage, for instance with air bearings or magnetic attraction.

Figure 4:
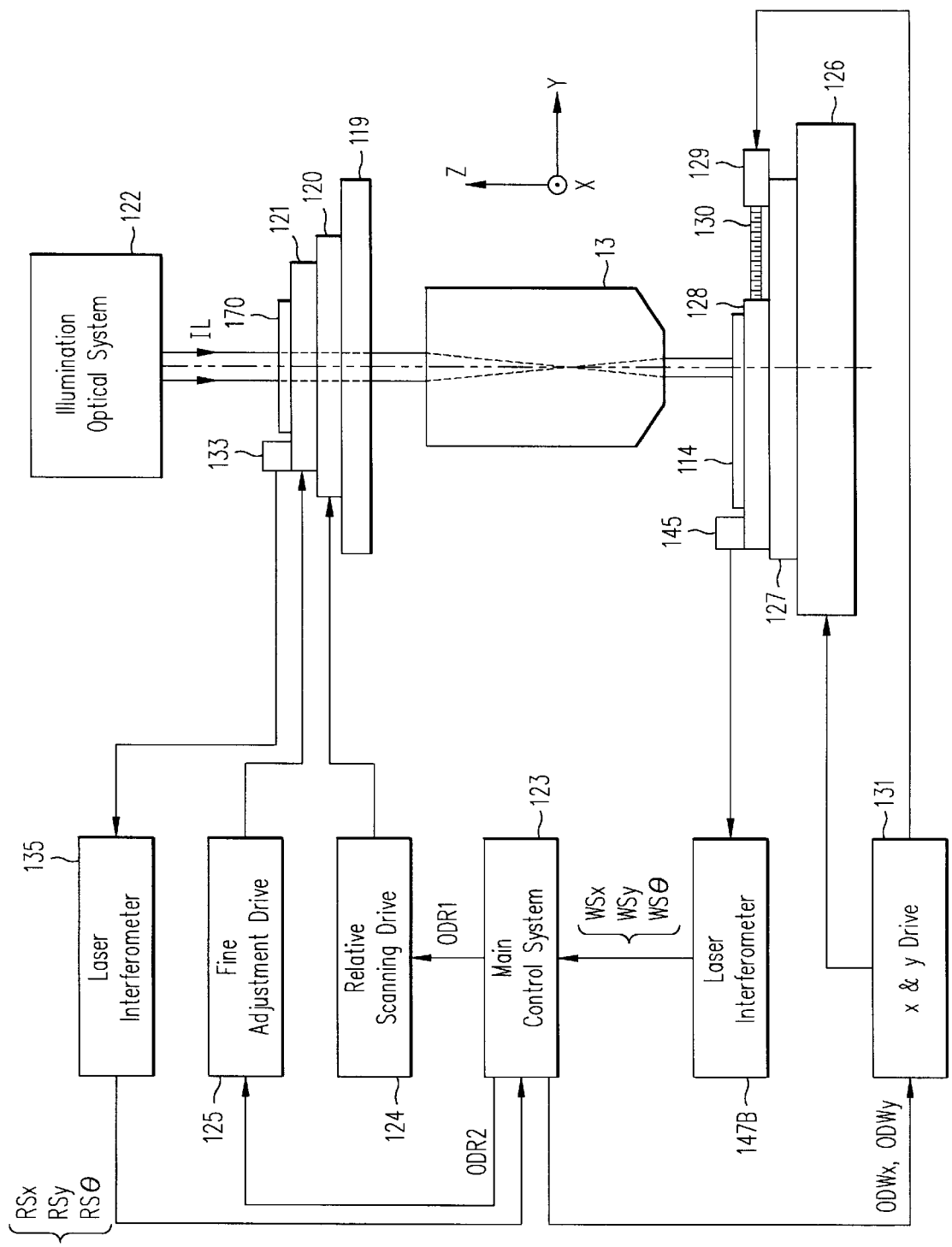
FIG. 4 shows a lithographic system in which the present stage assembly is used.
Figure 5:
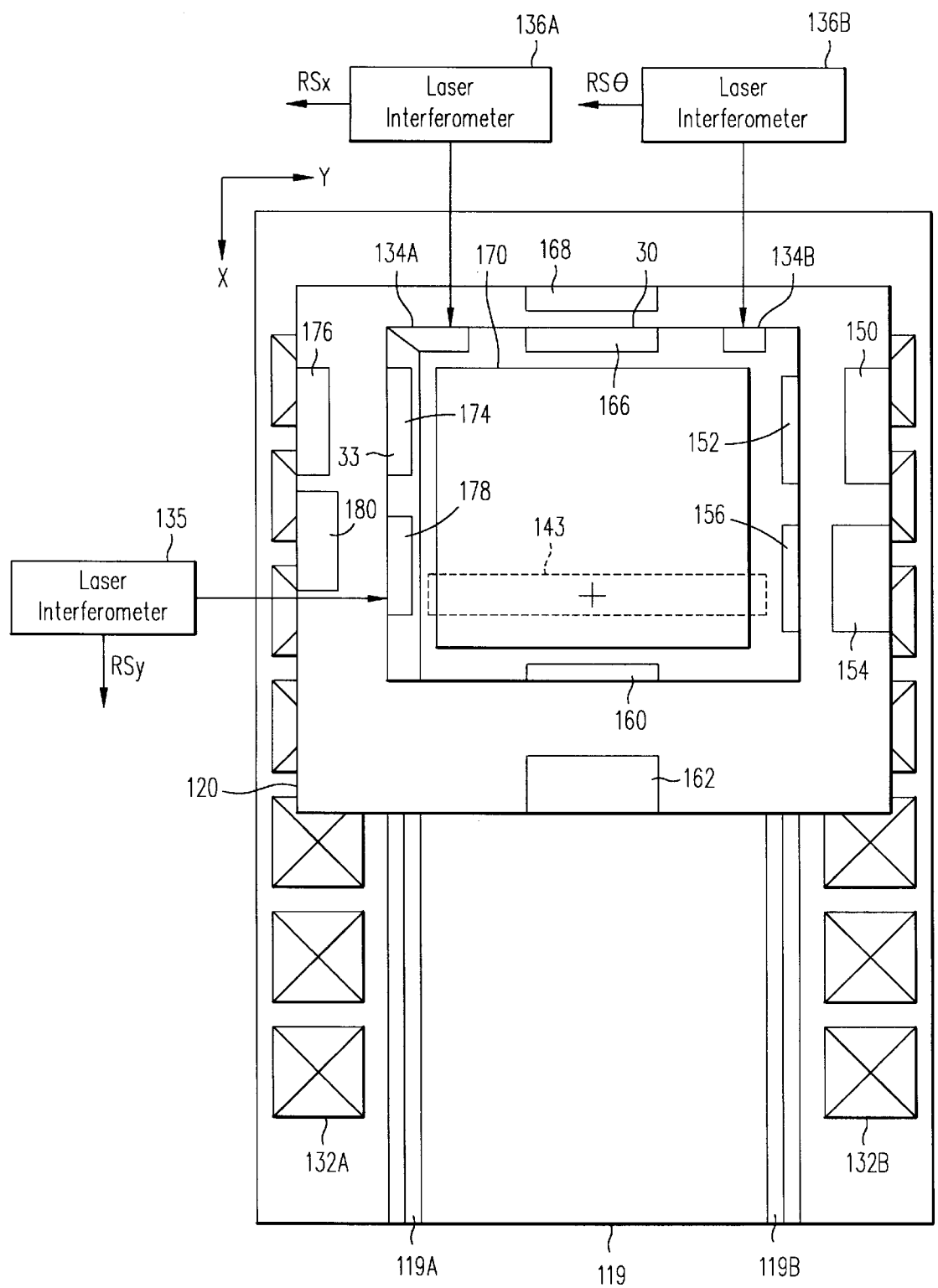
FIG. 5 shows detail of the FIG. 4 system.

An application of the present invention is in a projection apparatus as shown in FIG. 4, which is from U.S. Pat. No. 5,477,304 to Nishi, incorporated herein by reference; for a description of the elements see Nishi, FIG. 1. Present FIG. 5 is similar to Nishi FIG. 2, but substitutes the E-I core actuators of the present disclosure for the actuators on stage 30. As shown, there are E-I core pairs 150,152; 154,156; 160,162; 168,170; 174,176; and 178/180 driving stage 30. Due to the conventionality of the other elements of FIGS. 4 and 5, no further disclosure is provided herein.

This description is illustrative and not limiting; further modifications will be apparent to one skilled in the art in light of this disclosure. For instance, there is no requirement to use E/I core actuators; other types of opposing attractive (or alternatively repulsive) actuators may be used. Suitable adjustments to the control equations are made, depending on the control characteristics of the actual actuators, as will be understood by one of ordinary skill in the art. Also the above described extension to additional degrees of freedom is encompassed within the scope of this invention, which is defined by the appended claims.

We claim:

1. A method for moving an object along an axis, opposing magnetic actuators being associated with the object for movement along the axis, the method comprising:

determining a total travel of the object along the axis;

determining a position of the object along the axis; and sourcing an amount of electric current to one of the actuators, the amount of current being a function of the position of the object, the total travel, and a force to be exerted on the object by the one actuator.

2. The method of claim 1, wherein each actuator is an attractive only actuator.

3. The method of claim 2, wherein each actuator is an E/I core actuator.

4. The method of claim 1 wherein the total travel is D, the position is X, and the force is f, and wherein the current $$I = \frac{X}{D}\sqrt{f}.$$

5. The method of claim 3, wherein the position of the object is a gap between the E and I cores.

6. The method of claim 1, wherein the object is a stage in a projection exposure apparatus.

7. A stage assembly comprising:

a stage movable along an axis;

opposing actuators being associated with the stage for movement along the axis;

a sensor which measures a position of the stage along the axis; and a controller coupled to the actuators to control an amount of electrical current sourced to each actuator, wherein the amount of current is a function of the measured position of the stage, a total travel of the stage along the axis, and a force to be exerted by each actuator.

8. The assembly of claim 7, wherein each actuator is an attractive only actuator.

9. The assembly of claim 7, wherein each actuator is an E/I core actuator.

10. The assembly of claim 7, wherein the total travel is D, the measured position is X, and the force is f, and the current $$I = \frac{X}{D}\sqrt{f}.$$

11. The assembly of claim 7, wherein the position of the object is a gap between the E and I cores.

12. The assembly of claim 7, wherein the stage assembly is a part of a projection exposure apparatus.

* * * * *